United States Patent

Hungerbühler

[11] Patent Number: 5,255,365
[45] Date of Patent: Oct. 19, 1993

[54] METHOD AND APPARATUS FOR COMPACTING DIGITAL TIME SERIES DATA FOR DISPLAY ON A DIGITAL OSCILLOSCOPE

[75] Inventor: Viktor Hungerbühler, Meyrin, Switzerland

[73] Assignee: Le Croy S.A., Meyrin, Switzerland

[21] Appl. No.: 956,556

[22] Filed: Oct. 5, 1992

Related U.S. Application Data

[63] Continuation of Ser. No. 376,526, Jul. 7, 1989, abandoned.

[30] Foreign Application Priority Data

Jul. 12, 1988 [EP] European Pat. Off. ............ 88810477

[51] Int. Cl.$^5$ .............................................. G06F 15/20
[52] U.S. Cl. .................................... 395/164; 395/162; 395/128; 382/53
[58] Field of Search ................ 395/128, 162, 164, 166; 382/56, 53, 54; 340/747, 750; 364/200 MS File, 900 MS File

[56] References Cited

U.S. PATENT DOCUMENTS

| | | | |
|---|---|---|---|
| 4,110,564 | 8/1978 | Andresen | 179/15.55 T |
| 4,669,097 | 5/1987 | Bristol | 375/122 |
| 4,878,183 | 10/1989 | Ewart | 364/521 |
| 4,929,031 | 5/1990 | Hunt et al. | 364/518 |
| 4,953,106 | 8/1990 | Gansner et al. | 364/521 |

OTHER PUBLICATIONS

Dagostino et al.: "Catch glitches on slow sweeps with scope's Envelope mode" EDN Feb. 18, 1981. pp. 115–118.

Primary Examiner—Phu K. Nguyen
Attorney, Agent, or Firm—Oblon, Spivak, McClelland, Maier & Neustadt

[57] ABSTRACT

The method and apparatus provide for data compaction of time series data for display on a digital oscilloscope when the resolution M of the display screen is much smaller than N, the number of data points. All extreme data excursions are displayed and the form of the original signal is essentially preserved.

11 Claims, 3 Drawing Sheets

METHOD AND APPARATUS FOR COMPACTING DIGITAL TIME SERIES DATA FOR DISPLAY ON A DIGITAL OSCILLOSCOPE

This application is a Continuation of application Ser. No. 07/376,526, filed on 07/07/89, now abandoned.

The present invention relates to a method and an apparatus for compacting digital data, in particular for compacting digital time series data to be displayed on a display screen of a digital oscilloscope or transient recorder, when the number of data points available is larger than the horizontal resolution of the display screen.

Important applications of digital oscilloscopes involve the data acquisition for and display of high speed phenomena, for example in the areas of particle physics and the study of transient phenomena in electric power systems. High-speed data acquisition equipment samples the physical process and converts the sampled data into digital form. This data is stored in a memory as the original time series data. The number of data points, N, may typically go up to 100'000. This data has to be displayed on the display screen of the digital oscilloscope whose horizontal resolution allows the display of a maximum of M data points where M is typically around 1000.

The general problem therefore is to display time series data of N data points on a display screen with resolution M, where N is significantly larger than M. Typically, $N/M = L = 4-100$.

Known in the state in the art are two methods to handle this problem, both of which have major drawbacks:

1) M, i.e. about 1000, out of N, i.e. 100'000, datapoints are shown by using only the values of the data points $i, i+L, i+2L, i+3L, \ldots, i+(M-1)L$. Thus, only 1 out of L measured values is shown, the recorded data between the displayed datapoints are simply dropped. This method has the severe drawback that any interesting phenomenon between the displayed points is not shown. Short but significant value excursions may be totally missed. The method may also give rise to so-called 'aliasing' effects. Another way of expressing this is to say that the maximum observable frequency, the so-called Nyquist frequency, is reduced by a factor of L, greatly reducing the usefulness of the instrument.

2) The values shown are $j, j+1, j+2, \ldots, j+M-1$, where M is again about 1000. Only M consecutive datapoints are shown at a given time, but the user has the possibility to choose the starting point j, for example with a knob, so that he can scroll through the data record from beginning to end.

This method does not distort the data, i.e. there are no 'aliasing' effects, but it has the drawback that only a small portion of the data can be inspected at a time, making a visual analysis of the total signal very tedious, especially if short random value excursions have to be looked for or if there is a good chance that the whole record does not contain any significant data.

The problem therefore is to find a data compacting method which provides a display of the whole data record and of all significant value excursions.

More precisely, the problem is to provide a method and an apparatus for data compaction of a N data point signal for display on a display screen with horizontal resolution M where M is significantly smaller than N, so that the entire signal length and all significant maximum and minimum excursions, so-called 'glitches', will be displayed, no 'aliasing' introduced, and the displayed signal form closely approximates the display which would be obtained if all points could be displayed.

It is therefore an object of this invention as claimed to provide for a method and for an apparatus in a digital oscilloscope of compacting digital time series data of one resolution, N, to another resolution, M, compatible with the resolution of the display screen of the oscilloscope.

In accordance with the invention, the method comprises the steps of grouping the original N data points in an acquisition memory into M groups $G_j$, $j=1,\ldots,M$, of L contiguous data points each, where $M*L=N$, determining for each group $G_j$ the maximum and minimum values, $max_j$ and $min_j$, and storing them as a pair of values, $p_j$, in an auxiliary memory, selecting from the M pairs $p_j$, $j=1,\ldots,M$ in the auxiliary memory M display values $e_j$, $j=1,\ldots,M$, for storage in a display image memory and display on a M resolution display screen, so that the M values include all extreme value excursions of the original data and represent the original signal essentially undistorted. The advantage of the inventive method is to guarantee that all extreme value excursions are determined and available for display and that the displayed signal closely resembles the original signal.

In a preferred implementation of the invention, the selection step consists of iteratively considering the values of k1 pairs of max/min values, $p_i,\ldots,p_{i+k1-1}$, where k1 is at least 2, from the auxiliary memory, and of k2 of the most recently stored display values $e_{i-k2},\ldots,e_{i-1}$, where k2 is at least 1, in the display image memory, and based thereon choosing k1 display variables, $e_i,\ldots,e_{i+k1-1}$, from the 2*k1 values read from the auxiliary memory and storing them in the display memory, and repeating these steps, for $j=1, 1+k1,\ldots, M-k1+1$, until the display image memory is filled. In further preferred embodiments, k1 is equal to 2, and k2 is equal to 1, and $e_i$ and $e_1$ are obtained according to methods described in any of the claims 3 or 4. Any of these methods of choosing the display variables $e_i$ insures that no extremum is left out. In addition, if the signal to be displayed is smooth and monotonous, the choice is such that the display becomes smooth.

The invention also provides for an apparatus to implement the inventive method, the apparatus comprising a data acquisition memory, data compaction means, a display image memory and a display screen, the apparatus being characterized by the data compaction means comprising a control unit, a maximum calculator to determine maxima and minima of subgroups of data in the data acquisition memory, an auxiliary memory for storing pairwise the maximum and the minimum of each subgroup, and a selector means for iteratively selecting values to be stored in the display image memory, all connected over a data bus and a control bus to each other and to the data acquisition memory and the display image memory.

Further advantageous embodiments of the inventive apparatus are described in dependent claims 6-11.

The invention is now described more in detail on the basis of FIG. 1-3.

FIG. 1 gives an overview of the inventive apparatus

Figure 1:
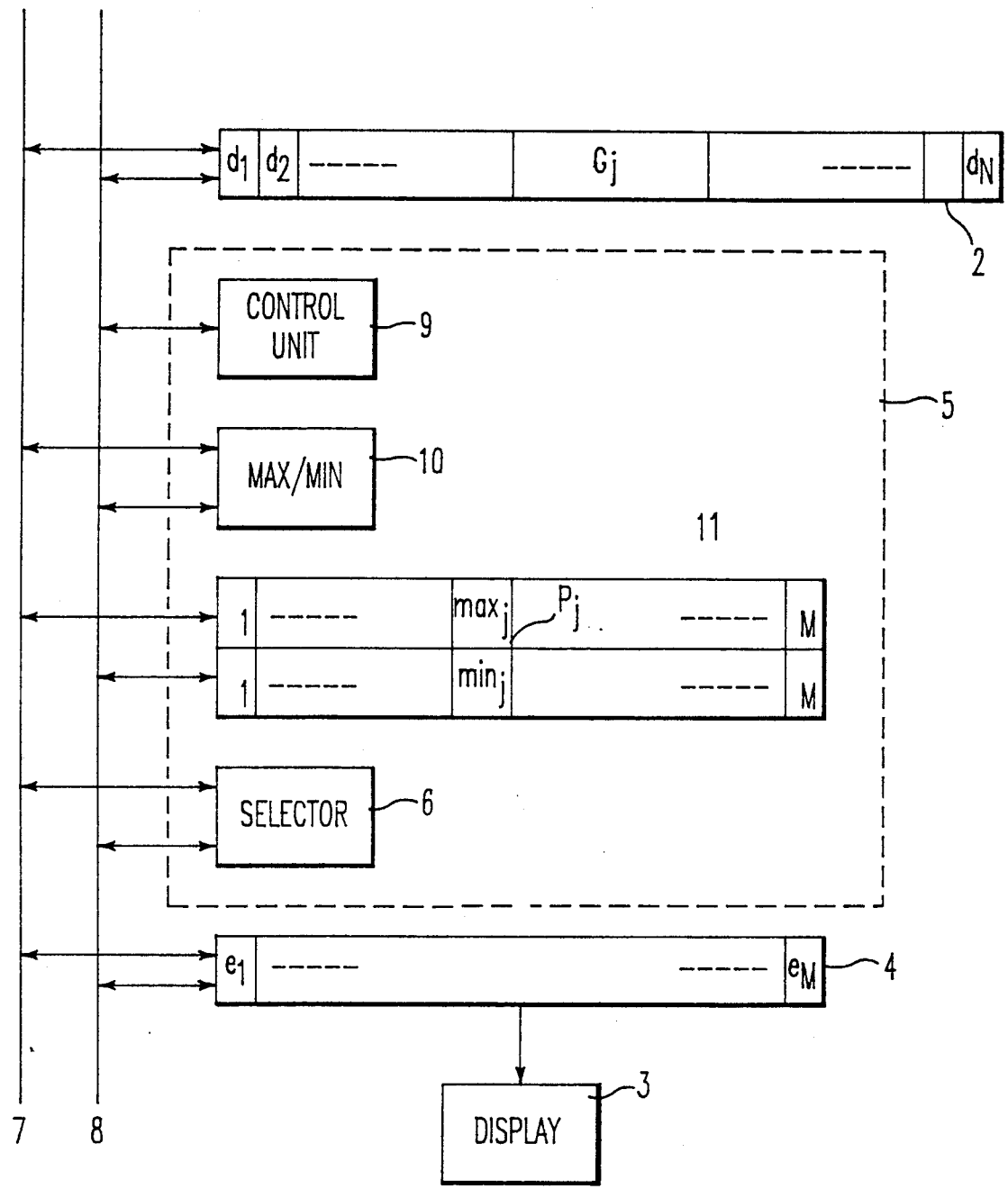

Referring to FIG. 1, there are schematically shown the components of a digital oscilloscope which concern this invention. Through a data acquisition input port (not shown) original time series data, comprising N data points, are entered into the data acquisition memory 2, comprising N locations. This data is to be displayed in compacted form on the display screen 3 which receives its input from the display image memory 4. Since the display screen 3 allows for a horizontal resolution M, the display image memory 4 has M memory locations. The number of bytes per location is in accordance with the required vertical resolution of the display. The actual display can be a raster display or a vector display, although for better quality of the display of the signal form vector graphic displays are preferred.

A data compaction means 5 is connected to the data acquisition memory 2 and the display image memory 4 over a data bus 7 and a control bus 8.

As the data compaction is carried out under the supervision of a control unit 9, the original data is divided into M subgroups $G_j, j = 1, \ldots, M$. For each subgroup the L data points are sequentially transferred to a max-min calculator 10, which determines the maximum, $max_j$, and the minimum, $min_j$, of the L data points in $G_j$. $max_j$ and $min_j$ are then stored in the j-th location pair of an auxiliary memory 11.

Figure 2:
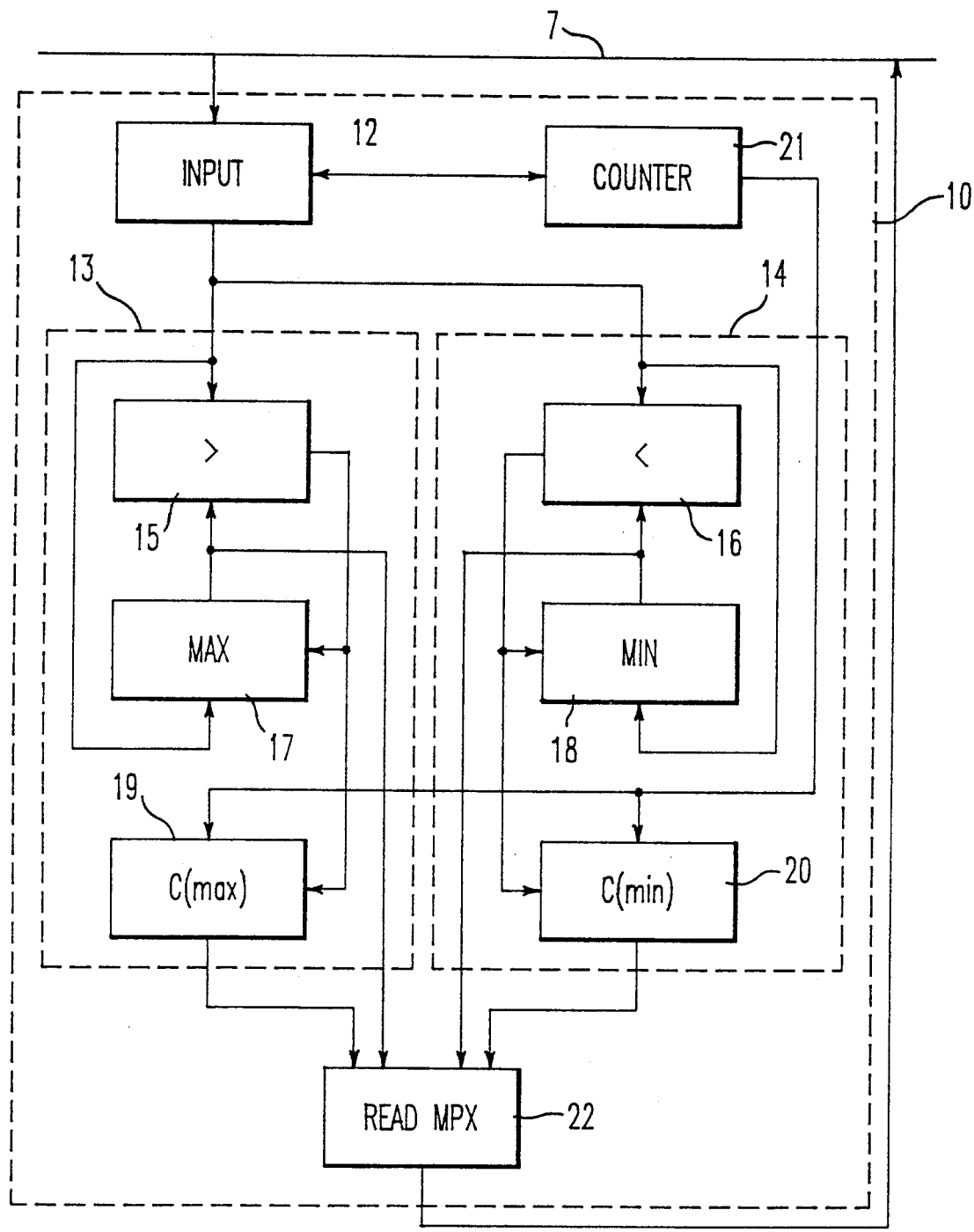
FIG. 2 shows a preferred embodiment of the max/-min comparator.

In a second part of the compaction method, the M locations of the display image memory 4 are iteratively filled by the selector means 6, by considering the values of k1 max-min pairs at a time from the auxiliary memory 11 and of k2 of the most recently stored values in the display image memory 4 and by determining, based on these values, which k1 values of the 2*k1 values read from the auxiliary memory 11 should be stored in the display image memory 4, and in which order. Referring now to FIG. 2, the max-min calculator 10 grabs the data on the fly off the data bus 7 if an appropriate control bit appears on the load input of input register 12, and carries out parallel comparisons of the inputted value with the current maximum and the current minimum in max- and min-calculators 13 and 14. If the inputted value represents a new maximum or a new minimum the comparator 15 or 16 sends a load signal to the corresponding max-register 17 or min-register 18 to update the current minimum and maximum. In a further preferred embodiment, event registers 19 and 20 are loaded with the contents of an event counter 21, whenever the corresponding max-register 17 or min-register 18 is updated. When all L values of $G_j$ have been read and compared, the contents of the max-register 17 and the min-register 18 are written through the read-out multiplexer 22 across the data bus 7 into the j-th location pair of the auxiliary memory 11. Optionally, the contents of the event registers 19 and 20 can be read out to a further auxiliary memory. Their availability can be used to improve the selection of $e_j$ and the display of the signal in certain cases.

The implementation of the max-min comparator is preferably carried out in silicon technology (integrated circuits, gate arrays, etc.) to obtain the desired operational speed for handling large blocks of original time series data. If speed is less important a microprocessor implementation is also possible.

Figure 3:
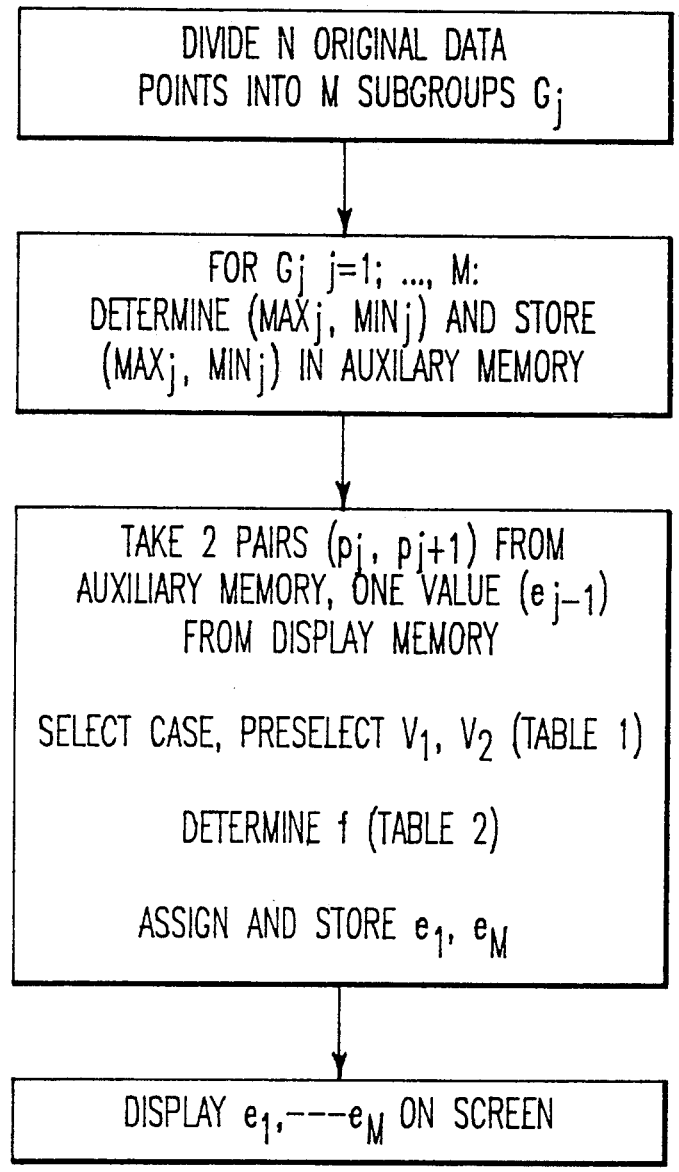
FIG. 3 shows the logic flow of the inventive method in its preferred realization.

As shown in the method flow diagram of FIG. 3, after the subdivision of the N original data points into M subgroups $G_j$, the max-min determination is carried out for all M data groups $G_j, j = 1, \ldots, M$, until the M pairs of a max- and a min- value each are stored in the auxiliary memory 11.

In the shown preferred method, k1 = 2 and k2 = 1, i.e. at a given point of the iteration of the selection step the two pairs $(max_i, min_i)$ and $(max_{i+1}, min_{i+1})$ and the most recently stored value $e_{i-1}$ are read to determine $e_i$ and $e_{i+1}$ (for i=0, $e_0$ is set equal to the first data value).

This is done by first selecting one of six cases, each case representing one of the six possible relative positions of the four values $max_i$, $min_i$, and $max_{i+1}$, $min_{i+1}$. Table 1 lists the six cases, the corresponding conditions, and the preselection of two values, v1 and v2. Since they always correspond to extreme values, the displaying of extremes of a signal is always assured.

TABLE 1

| Case k | Condition | Preselection v1, v2 |
|---|---|---|
| 1 | $max_i \geq min_i \geq max_{i+1} \geq min_{i+1}$ | $max_i, min_{i+1}$ |
| 2 | $max_i \geq max_{i+1} \geq min_i \geq min_{i+1}$ | $max_i, min_{i+1}$ |
| 3 | $max_{i+1} \geq max_i \geq min_i \geq min_{i+1}$ | $min_{i+1}, max_{i+1}$ |
| 4 | $max_i \geq max_{i+1} \geq min_{i+1} \geq min_i$ | $min_i, max_i$ |
| 5 | $max_{i+1} \geq max_i \geq min_{i+1} \geq min_i$ | $min_i, max_{i+1}$ |
| 6 | $max_{i+1} \geq min_{i+1} \geq max_i \geq min_i$ | $min_i, max_{i+1}$ |

This preselection of v1 and v2 and the subsequent determination of their order take into consideration that a number of typical waveforms should be properly displayed:

a monotonous (single slope) signal form
a single local extremum, either maximum or minimum
a single positive or negative step function.

Cases with multiple extrema are less important, since the preselection of v1 and v2 guarantees that at least the most extreme excursions are caught, their exact number and order are less important.

In a second step, it is determined in which order the preselected values v1 and v2 will be assigned to location $e_i$ and $e_{i+1}$. This is done in function of a logical variable f (for each of the six cases), such that $e_i = v1 \cdot f + v2 \cdot f'$ $e_{i+1} = v1 \cdot f' + v2 \cdot f$ where the prime (') signifies the logical complement.
The logical function f is determined according to Table 2.

TABLE 2

| Case | Logical function f | where |
|---|---|---|
| 1 | 1 | |
| 2 | 1 | |
| 3 | DB + DA' + A'C' | $D = e_{i-1} \geq (max_i + min_i)/2$<br>$A = min_i - min_{i+1} \geq max_{i+1} - max_i$<br>$B = max_i - min_i \geq min_i - min_{i+1}$<br>$C = max_i - min_i \geq max_{i+1} - max_i$ |
| 4 | D'B + D'A' + A'C' | D as above<br>A as above<br>$B = max_{i+1} - min_{i+1} \geq max_i - max_{i+1}$<br>$C = max_{i+1} - min_{i+1} \geq min_{i+1} - min_i$ |
| 5 | 1 | |
| 6 | 1 | |

In a variation of the method, for cases 1 and 2, as well as for cases 5 and 6, the assignment of the value $e_i$ is made dependent on the value of $e_{i-1}$, in order to produce a smoother signal display:

For cases 1 and 2, if $e_{i-1} \geq max_i$, $e_i = min_i$.
For cases 5 and 6, if $e_{i-1} \geq min_i$, $e_i = max_i$.
The determination of $e_{i+1}$ remains unchanged.

The selector step is carried out in the selector 6 which can be implemented in conventional logical circuitry, the functions of tables 1 and 2 being implemented in a first and a second logical unit, or as a software implementation on a microprocessor.

I claim:

1. A method for displaying time series data points on a display screen of a digital oscilloscope wherein the screen of said digital oscilloscope has a horizontal resolution of M comprised of the steps of:

accepting an electrical signal, at at least one input, of said oscilloscope;

digitizing said accepted signal into digitized time series data of N data values, wherein N is a multiple of M;

storing a group of the digitized N data points, in an acquisition memory in M groups $G_j$, $J=1,\ldots,M$, of L contiguous data points each, where $M*L=N$;

storing in an auxiliary memory, for each group $G_j$, a determined maximum and minimum value ($max_j$ and $min_j$), as a pair of values ($P_j$);

selecting from said M pairs $P_j$, $j=1,\ldots,M$, in said auxiliary memory, a series of display values $e_j j=1,\ldots M$, based upon an evaluation of those values in the pairs which include all extreme value excursions of said inputted signal and which represent an undistorted image of said signal;

shifting said selected series of display values into a display image memory; and displaying an image based upon said display values stored in said display image memory.

2. Method according to claim 1 characterized in that the selecting consisting of iteratively considering the values of k1 pairs of max-/min values, $p_i,\ldots,p_{i+k1-1}$, where k1 is at least 2, from the auxiliary memory and of k2 of the most recently stored display values $e_{i-k2},\ldots,e_{i-1}$, in the display image memory, where k2 is at least 1, selecting, based on said k1 pairs and k2 display values, k1 display variables, $e_i,\ldots e_{i+k1-1}$, said k1 display variables in the display memory, repeating these steps until the display image memory is filled.

3. Method according to claim 2 characterized in that k1=2 and k2=1 and that the choosing consists of determining which condition k, $k=1,\ldots,6$, of Table 1 selecting for the applicable case K, $K1,\ldots,G$, variables $v_1$ and $v_2$ according to Table 1 and as logical variable f according to Table 2

TABLE 1

| Case k k | Condition k | selection v1, v2 |
|---|---|---|
| k = 1 | $max_i \geq min_i \geq max_{i+1} \geq min_{i+1}$ | $max_i, min_{i+1}$ |
| k = 2 | $max_i \geq max_{i+1} \geq min_i \geq min_{i+1}$ | $max_i, min_{i+1}$ |
| k = 3 | $max_{i+1} \geq max_i \geq min_i \geq min_{i+1}$ | $min_{i+1}, max_{i+1}$ |
| k = 4 | $max_i \geq max_{i+1} \geq min_{i+1} \geq min_i$ | $min_i, max_i$ |
| k = 5 | $max_{i+1} \geq max_i \geq min_{i+1} \geq min_i$ | $min_i, max_{i+1}$ |
| k = 6 | $max_{i+1} \geq min_{i+1} \geq max_i \geq min_i$ | $min_i, max_{i+1}$ | and assigning $e_i = f*v1 + *f*v2$ and $e_{i+1} = f*v1 = f*v2$ Table 2,

TABLE 2

| Case k | Logical variable f | where |
|---|---|---|
| k = 1 | 1 | |
| k = 2 | 1 | |
| k = 3 | DB + DA' + A'C' | $D = e_{i-1} \geq (max_i + min_j)/2$ |
| | | $A = min_i - min_{i+1} \geq max_{i+1} - max_i$ |
| | | $B = max_i - min_i \geq min_i - min_{i+1}$ |
| | | $C = max_i - min_i \geq max_{i+1} - max_i$ |
| k = 4 | D'B + D'A' + A'C' | D as above |
| | | A as above |
| | | $B = max_{i+1} - min_{i+1} \geq max_i - max_{i+1}$ |
| | | $C = max_{i+1} - min_{i+1} \geq min_{i+1} - min_i$ |
| k = 5 | 1 | |
| k = 6 | 1 | | and assigning $e[i=f*v1+fv2 \text{ and } ei+1]=fv1+fv2$ and $e_{i-1}=fv1+f**v2$.

4. Method according to claim 3, characterized in that for cases k, k=2, 1, 2, 5, and 6, the logic according to Table 3 is used for determining $e_i$:

TABLE 3

| Case | Condition | | Assignment |
|---|---|---|---|
| k = 1 or 2 | if $e_{i-1} \geq max_i$ | then | $e_i = min_i$ |
| k = 5 or 6 | if $e_{i-1} \geq min_i$ | then | $e_i = max_i$ |

5. Apparatus in a digital oscilloscope for compacting original digital time series data comprising N data points for displaying on a display screen(3) of the digital oscilloscope of horizontal resolution M where N is a multiple of M, comprising a data acquisition memory(2), data compaction means(5), a display image memory(4) and a display screen(3), characterized in that the data compaction means(5) comprises a control unit(9), a max-min calculator(10) to determine maxima and minima of subgroups of data in the data acquisition memory(2), an auxiliary memory(11) for storing pairwise the maximum and the minimum of each subgroup, and a selector means(6) for iteratively selecting values to be stored in the display image memory(4), said control unit(3), max-min calculator(10), auxiliary memory(110 and selector means(6) being connected over a data bus(7) and a control bus(8) to each other and to the data acquisition memory(2) and the display image memory(4).

6. Apparatus according to claim 5, characterized in that the max-min calculator(10) comprises an input register(12), said input register(12) reading data from the data bus(7) and passing it to a max-calculator(13) and a min-calculator(14), the max-calculator (13) comprising a comparator(15) and a max-register(17) which is updated when the comparator(15) determines a new maximum, the min-calculator (14) comprising a comparator(16) and a min-register(18) which is updated when the comparator determines a new minimum, the max- and min-registers(17, 18) being connected to a read-out multiplexer(22) which passes the maximum and the minimum to the auxiliary memory(11).

7. Apparatus according to claim 6, characterized in that it further comprises a data counter(21) connected to two event registers(19,20) in the max- and min-comparators(13,14) in order to register for which data count the maximum and the minimum occur, the event registers(19,20) being connected to the read-out multiplexer(22) for passing the contents to second auxiliary memory.

8. Apparatus according to one of the claims 5-7, characterized in that the selector means(6) comprises logical circuits implementing the function of Table 1 and Table 2.

9. Apparatus according to one of the claims 5-7, characterized in that the selector means(6) is implemented by a microprocessor.

10. Apparatus according to claims 5, 6 or 7 characterized in that the max-min comparator(10) is implemented by a microprocessor.

11. Apparatus according to claims 5, 6 or 7 characterized in that the max-min comparator(10) is implemented by silicon technology.

* * * * *